United States Patent [19]

Malewski et al.

[11] Patent Number: 4,825,153
[45] Date of Patent: Apr. 25, 1989

[54] SHUNT ELEMENT FOR MEASURING CURRENT COMPRISING COMPENSATION MEANS

[75] Inventors: Ryszard Malewski, St. Lambert; Marc Leclerc, Boucherville, both of Canada

[73] Assignee: Hydro-Quebec, Quebec, Canada

[21] Appl. No.: 21,751

[22] Filed: Mar. 4, 1987

[30] Foreign Application Priority Data

Nov. 5, 1986 [CA] Canada ............................ 522214

[51] Int. Cl.$^4$ .......................... G01R 1/20; H01C 5/00
[52] U.S. Cl. .................................. 324/126; 338/49
[58] Field of Search ............... 324/126; 338/49, 322; 307/89, 91

[56] References Cited

U.S. PATENT DOCUMENTS

| | | | |
|---|---|---|---|
| 1,050,694 | 1/1913 | Roller | 338/49 |
| 2,640,092 | 5/1953 | Fett et al. | 324/126 |
| 4,240,059 | 12/1980 | Wolf et al. | 338/49 |
| 4,494,068 | 1/1985 | Ley et al. | |

FOREIGN PATENT DOCUMENTS 1216981 5/1966 Fed. Rep. of Germany ...... 324/126
1002972 3/1983 U.S.S.R. ............................ 324/126

OTHER PUBLICATIONS

Malewski et al; "Elimination of the Skin Effect Error in Heavy-Current Shunts"; IEEE Transactions on Power Apparatus and Systems; vol. PAS-100; No. 3; Mar. 1981; pp. 1333-1340.

Primary Examiner—Ernest F. Karlsen
Attorney, Agent, or Firm—Oblon, Fisher, Spivak, McClelland & Maier

[57] ABSTRACT

In order to minimize the effect of return current flow on a current measuring shunt, the present invention proposes a shunt having a compensation circuit to compensate for the asymmetrical effect of such return currents. Such compensation is provided by two measuring circuits which are to measure the voltage drop across the shunt, and each circuit is located in a median plane of the shunt. The path of each of these measuring circuits is optimized and established in the calibrated configuration of the shunt. These parallel measuring circuits also have their inputs and outputs connected together respectively. Particularly, the present invention relates to shunts having a tubular or rectangular configuration and including such compensation circuits.

7 Claims, 1 Drawing Sheet

SHUNT ELEMENT FOR MEASURING CURRENT COMPRISING COMPENSATION MEANS

BACKGROUND OF INVENTION

1. Field of Invention

The present invention relates to a system for compensating for the asymmetrical effect of return current in a measuring shunt and particularly to shunts with return measuring conductors which may have a slightly different configuration.

DESCRIPTION OF PRIOR ART

2. A shunt is a measuring element for measuring heavy currents which may be transient, alternating, or continuous. The shunt functions on the principle that the current flowing therethrough produces a voltage drop across the shunt and that the difference in voltage permits, by the use of Ohm's law, to calculate the intensity of the current.

The circuit to measure the difference in potential drop is constituted by a measuring conductor wire which is located in a groove which is formed in the interior of the resistive element of the shunt and which is connected, such as by soldering, to the opposed end of the shunt.

The measuring properties of the shunt are characterized by the rated value of the resistance of the shunt material as well as by the response of the shunt to a current step. Ideally, the response of the shunt measured at the output of the measuring circuit should be a replica of the current variation at the input of the shunt. However, the response of the shunt shows most often a long rise time due primarily to the skin effect of the resistive material, and secondly due to the effect of return currents.

The effect of these return currents is nil when the return is at an infinite distance or the shunt is of a tubular form and the return current is distributed uniformly about the shunt axis.

For a given configuration of a shunt and of the return conductors, and particularly a calibrated configuration, the difference between the response of the shunt and the applied signal may be reduced by optimizing the path of the measuring conductor embedded at the interior of the resistive element. A change in the geometrical configuration of the shunt and its return conductors will affect the response of the shunt and limit its utilization.

SUMMARY OF INVENTION

It is therefore a feature of the present invention to provide compensation means to reduce the asymmetrical effects of the return currents on the shunt response.

Another feature of the present invention is to provide a measuring shunt having a tubular geometry with the means to compensate for the asymmetrical effects of the return currents on the shunt response.

Another feature of the present invention is to provide a shunt of a rectangular configuration with the means to compensate for the asymmetrical effects of the return currents on the response of the shunt.

A broad aspect of the present invention is to provide a current measuring shunt with the compensation means in order to reduce the asymmetrical effects of the return current on the response of the shunt. These compensation means are characterized by disposing two measuring circuits in a respective longitudinal plane of the shunt whereby to measure the voltage drop across the shunt resistive element. The path of each of these measuring circuits is optimized and calibrated according to the configuration of the shunt. These parallel measuring circuits have their input and output terminal ends connected with one another whereby to obtain an average response.

The above invention minimizes the variations in the response of the shunt particularly when the configuration of the heavy current circuit "in situ" does not correspond to the calibrated configuration.

BRIEF DESCRIPTION OF DRAWINGS

A preferred embodiment of the present invention will now be described with reference to the accompanying drawings in which.

DESCRIPTION OF PREFERRED EMBODIMENTS

Figure 1:
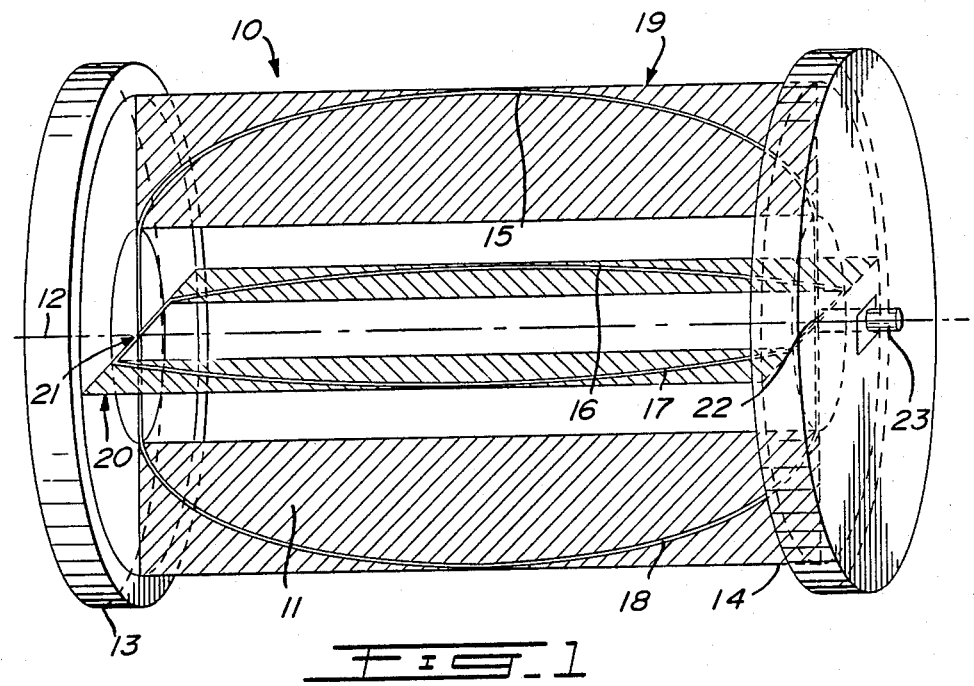
FIGS. 1 and 2 are schematic views of tubular and rectangular shunts having compensation means to reduce the asymmetrical effect of return currents. The geometry of these illustrated shunts in these two examples are symmetrical with respect to the central axis of the shunt. The measuring circuits provided in two longitudinal symmetrical planes follow the same mirror reflected path.

Referring to FIG. 1, there is shown generally at 10 the shunt of the present invention and constituted by a tubular resistive element 11 having an input terminal 13 and an output terminal 14 to permit passage of a heavy current across the shunt. The resistive element 11 is cut along two longitudinal planes 19 and 20, both these planes passing through the axis of symmetry 12 and being perpendicular to one another. The symmetrical plane 19 comprises two measuring circuits 15 and 18, each constituted by a groove or channel in which is inserted an insulated measuring conductor and the path of each being established in accordance with an optimized path for this type of shunt. Similarly, the symmetrical plane 20 also has tow measuring circuits 16 and 17 and the path of which is also established in accordance with the optimized path for the tubular shunt. Each of the measuring conductors has its input ends 21 connected in parallel and secured to an input terminal 13. Their output ends are also connected in parallel at a common point 22 and further connected to a coaxial output cable 23 disposed concentrically in the output terminal 14.

With this type of shunt, the input and output terminals are usually constituted by solid discs 13 and 14 made of brass or copper. The tubular resistive element 11 is generally constituted by an alloy of resistive material such as constantane, manganine or nichrome alloy.

Figure 2:
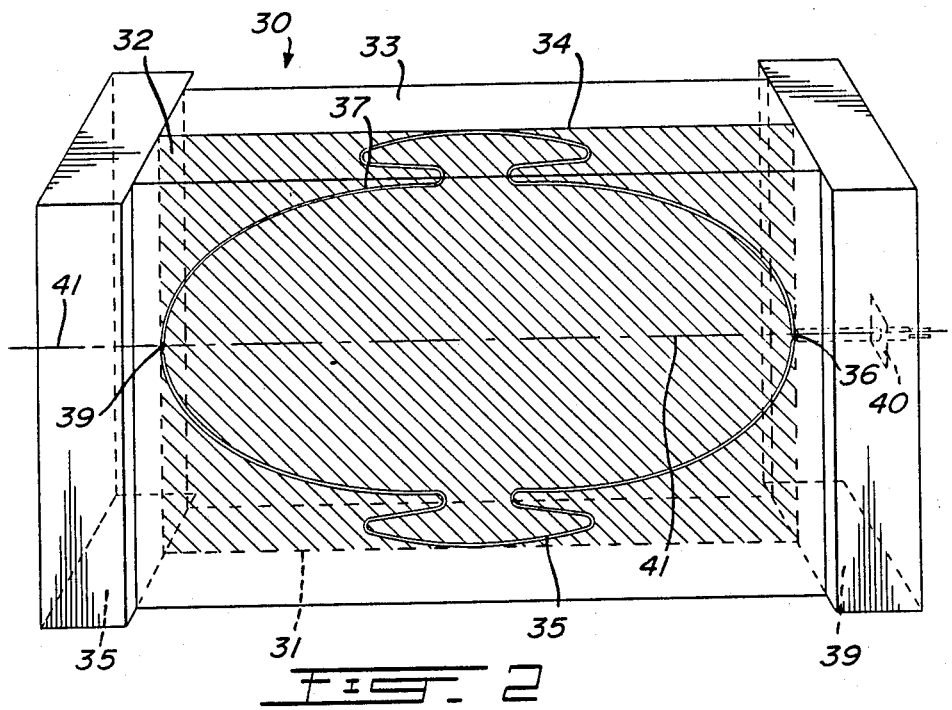

Referring now to FIG. 2, there is shown a shunt having a flat or rectangular configuration. This shunt 30 is constituted by a rectangular resistive element 31 having an input terminal 35 and an output terminal 39 for connecting heavy current across the shunt. The rectangular resistive element 31 comprises two rectangular plates 32 and 33 which are juxtaposed to one another and wherein the juxtaposed plane is a longitudinal plane of symmetry 34 passing through the longitudinal symmetrical axis of the shunt 41. The plane of symmetry 34 comprises two measuring circuits 35 and 37, each having a path which is established in accordance with the optimized path for the calibration configuration of the shunt. These measuring circuits are constituted by grooves or channels formed at the interior surface of each of these planes and in which is installed a measuring conductor of which the input ends 39 are connected to the input terminal 39 and the output ends 36 are connected to an output cable 40 which extends through the output terminal at the center thereof.

These shunts are usually constructed with the input and output terminals constituted by solid plates of brass or copper. The rectangular resistive element is generally constituted by a resistive alloy, such as constantane, manganine, or nichrome.

These shunts may be utilized when the configuration of the transmission lines or substation buss-bars is modified and their configuration no longer corresponds to the calibrated configuration.

Particularly, these shunts may be utilized in test laboratories or with distribution lines carrying heavy currents.

It is within the ambit of the present invention to cover any obvious modifications of the examples of the preferred embodiment described herein, provided such modifications fall within the scope of the appended claims.

We claim:

1. A shunt for measuring current comprising a massive shunt resistive element for carrying heavy current and having an input and an output terminal, compensation means to reduce the effect of asymmetric return currents on the shunt response and including at least two measuring circuits for measuring the voltage drop and disposed in a longitudinal plane of the shunt element, each of said measuring circuits being comprised of an insulated conductor having an optimized path established in the calibrated configuration of the said shunt, each said optimized paths being symmetrical to one another, both said insulated conductors further having an input end connected together and to said input terminal and an output end connected to an insulated output connection.

2. A shunt as claimed in claim 1 wherein said insulated conductors are sandwiched in respective planes relative to the longitudinal central axis of said shunt between opposed faces of two rectangular resistive elements.

3. A shunt as claimed in claim 1 or 2 wherein said shunt has a tubular configuration.

4. A shunt as claimed in claim 1 or 2, wherein said shunt has a rectangular configuration.

5. A tubular shunt for measuring heavy currents and comprising a tubular resistive element having an input terminal and an output terminal for passing a heavy current through said shunt, said resistive element having at least two measuring circuits for measuring the voltage drop produced across the shunt, said measuring circuits each being comprised of an insulated conductor having an optimized path established in the calibrated configuration of the shunt, said measuring circuits being disposed in the shunt resistive element in pairs and in different longitudinal symmetrical planes, with said planes being symmetrical to one another and in relation to the longitudinal central axis of the shunt, said insulated conductors having an input and an output end connected together, said output connected ends being connected to a coaxial cable which is disposed concentrically in said output terminal of said shunt.

6. A shunt as claimed in claim 5, wherein said resistive element comprises four measuring circuits for measuring the voltage drop across the shunt, said measuring circuits being sandwiched between sections of said shunt resistive element.

7. A shunt as claimed in claim 5 or 6, wherein said input and output terminals of said shunt are constituted by solid brass or copper discs or rings.

* * * * *